United States Patent
Miles et al.

[19]

[11] Patent Number: 6,054,892
[45] Date of Patent: Apr. 25, 2000

[54] TIMING CIRCUIT

[75] Inventors: David John Miles; Richard Goldman, both of Gloucestershire, United Kingdom

[73] Assignee: Telefonaktiebolaget LM Ericsson (publ), Stockholm, Sweden

[21] Appl. No.: 09/112,103

[22] Filed: Jul. 8, 1998

[30] Foreign Application Priority Data

Jul. 10, 1997 [GB] United Kingdom .................... 9714575

[51] Int. Cl.⁷ ........................................... H01L 35/00
[52] U.S. Cl. .............................. 327/512; 327/77; 327/83
[58] Field of Search ................................. 327/77, 80, 81, 327/83, 84, 85, 87, 88, 89, 90, 509, 512, 513

[56] References Cited

U.S. PATENT DOCUMENTS

| | | | |
|---|---|---|---|
| 3,393,328 | 7/1968 | Meadows et al. | 307/310 |
| 3,766,444 | 10/1973 | Bosch | 317/234 R |
| 3,951,091 | 4/1976 | Doench | 114/211 |
| 4,044,348 | 8/1977 | Huebscher | 340/227.1 |
| 4,058,779 | 11/1977 | Fraley | 331/108 R |
| 4,377,346 | 3/1983 | Beaver et al. | 374/1 |
| 4,660,057 | 4/1987 | Watanabe et al. | 346/140 R |
| 5,032,874 | 7/1991 | Matsuuchi | 355/285 |
| 5,184,509 | 2/1993 | Kienzle et al. | 73/204.14 |
| 5,229,578 | 7/1993 | Kusano et al. | 219/497 |
| 5,435,180 | 7/1995 | Uchiyama et al. | 73/204.19 |
| 5,838,187 | 11/1998 | Embree | 327/512 |

FOREIGN PATENT DOCUMENTS

| | | |
|---|---|---|
| 0 657743 A2 | 6/1995 | European Pat. Off. . |
| 0 701687 A1 | 7/1999 | European Pat. Off. . |
| 2853238 | 7/1980 | Germany . |

OTHER PUBLICATIONS

*Basic Integrated Circuit Engineering,* McGraw–Hill 1975, pp. 84, 413–416.

*Primary Examiner*—Jeffrey Zweizig
*Attorney, Agent, or Firm*—Jenkens & Gilchrist, P. C.

[57] ABSTRACT

A timing circuit, for use in an integrated circuit, generates relatively long time periods. The electrical properties (for example the resistance) of a pair of matched components are measured while heat is supplied to one of the components. When the values of the thermally dependent properties of the components differ by a certain amount, the timed period is over. The pair of matched components are located within thermally insulating structures within the IC.

13 Claims, 1 Drawing Sheet

TIMING CIRCUIT

TECHNICAL FIELD OF THE INVENTION

This invention relates to a timing circuit, in particular for use in an integrated circuit.

DESCRIPTION OF RELATED ART

A relatively common requirement in electrical circuit design is the need for a timing circuit which generates a signal whose value changes from one state to another (for example on/off) at a relatively slow rate, for example with a period of the order of one second or longer. Conventionally, in integrated circuits, such delays have been provided by using digital counting circuits, including clock circuitry, or by the use of large capacitors, which can be charged or discharged over relatively long periods.

However, both of these solutions are relatively inefficient, in the sense that they occupy relatively large areas in an integrated circuit, and/or require additional external components, for example a crystal to provide a clock for a digital delay circuit or the capacitor which is charged and discharged.

An example of the former is illustrated in "The Art of Electronics" by Horowitz and Hill, 2nd Edition, FIG. 8.68, while an example of the latter is described in section 5.14 of the same book.

The present invention seeks to provide a timing circuit which can be implemented using much less space in an integrated circuit and which provides a relatively long delay to a degree of accuracy which is acceptable in at least some circumstances, and uses no external components.

SUMMARY OF THE INVENTION

The present invention thus seeks to provide a timing circuit which can be implemented entirely within an integrated circuit, without occupying a large surface area thereof.

The timing circuit in accordance with the invention comprises two or more matched components, having at least one property which is dependent on the temperature of the component. For example, with two matched components, each of the components is fabricated within its own thermally insulating structure within an integrated circuit, and one of the components is located adjacent to a heating element. Electrical signals which vary with the value of the temperature dependent property are taken from each component, and compared, and the heating element applies heat to one of the components, until the values of the temperature dependent parameters differ sufficiently that the values of the electrical signals differ by a predetermined amount. At that point, an output can be given, representing the end of the timed period, and the heating element can be switched off.

Preferably, the thermally insulating structures comprise trenches, surrounding the respective components, containing an insulating material. For example, in the case of an integrated circuit formed on silicon, the trench structures may conveniently contain silicon dioxide, which has a thermal conductivity which is approximately 1% of that of silicon.

The circuit in accordance with the invention has the advantage that it can be implemented easily in an integrated circuit, and provides a delay with a relatively long time period, having an accuracy which is acceptable for at least some purposes.

DETAILED DESCRIPTION OF PREFERRED EMBODIMENTS

Figure 1:
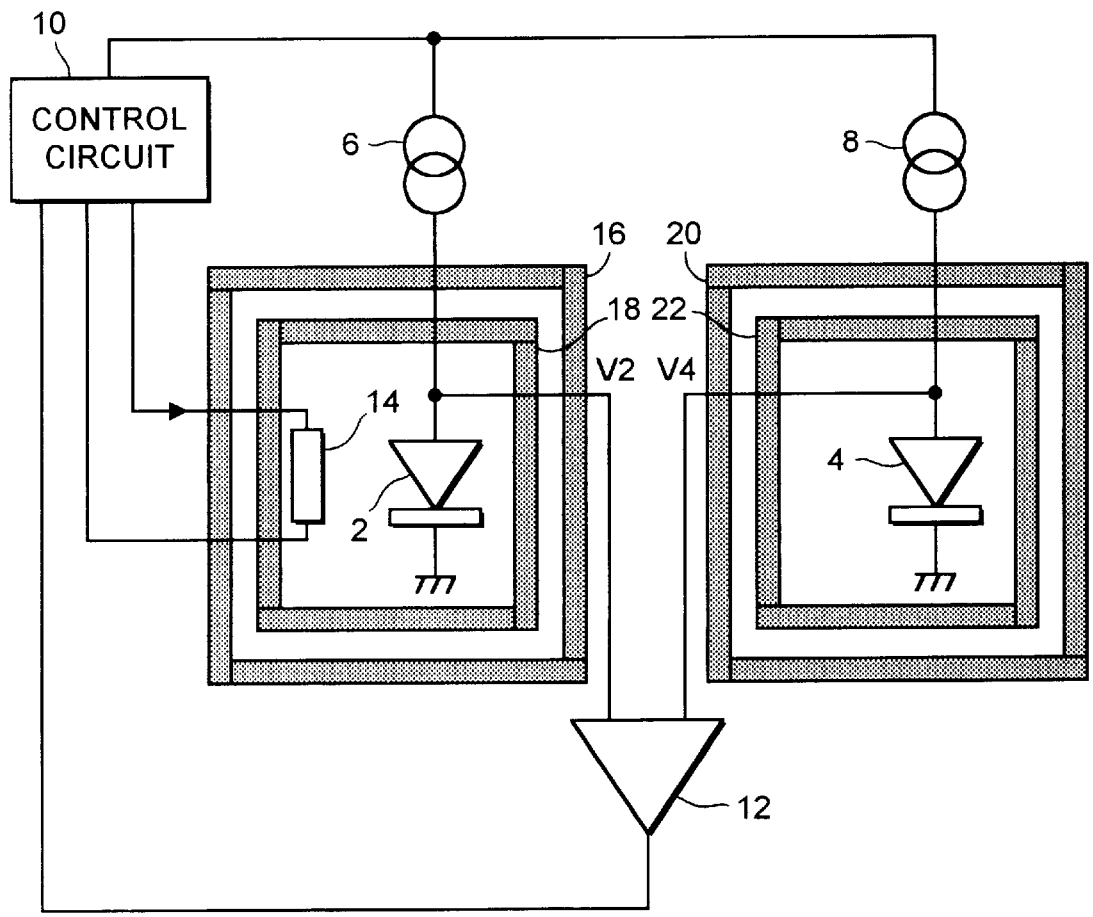
FIG. 1 is a schematic illustration of a timing circuit in accordance with the invention.

FIG. 1 is a schematic view of a timing circuit in accordance with the invention. This illustrative example uses a temperature-dependent property of a diode, but other components, such as resistors or transistors (MOS or bipolar), or zener diodes, could equally well be used. The circuit is built around a pair of matched diodes 2, 4, each of which is supplied with a forward bias current from a respective constant current source 6, 8, within an integrated circuit. The current sources 6, 8 are controlled by a control circuit 10 and in this case supply equal currents to the two diodes 2, 4 respectively. The forward voltage drops V2, V4 across the diodes 2, 4 are supplied to the input terminals of a comparator 12, and the result of the comparison is supplied to a control circuit 10.

A heating element 14, which may be an integrated resistor, but may also be some other device, for example a diode or diode connected bipolar or MOS transistor, or a zener diode, is located in close proximity to the diode 2, and the current supplied to the heating element is also supplied from the control circuit 10.

The invention is described herein with reference to a circuit with two insulating trench structures, each including a respective temperature dependent component. However, it will be appreciated that more than two such structures may be used, and/or that each insulating structure may contain two or more components connected in series or parallel.

The temperature dependent components are described herein as "matched" which may mean that they have the same size, shape and electrical parameters, but may also mean that they have sizes or other parameters which are in a known ratio, or differ by a known amount, provided that the comparator can compensate for any expected difference in the measured parameters.

An essential feature of the invention is that the diode 2 and heating element 14 are surrounded by a thermally insulating structure within the integrated circuit. Similarly, the diode 4 is contained within another thermally insulating structure. Specifically, the diode 2 and heating element 14 are surrounded by trenches 16, 18 formed within the silicon of the integrated circuit, and containing an insulating material, perhaps most conveniently silicon dioxide. Similarly, the trench structure surrounding the diode 4 includes a pair of trenches 20, 22.

The structure of each trench, in itself, may be similar to trenches which are used in integrated circuits to provide electrical isolation of components, and a large variety of fabrication techniques are well known to those skilled in the art.

Figure 2:
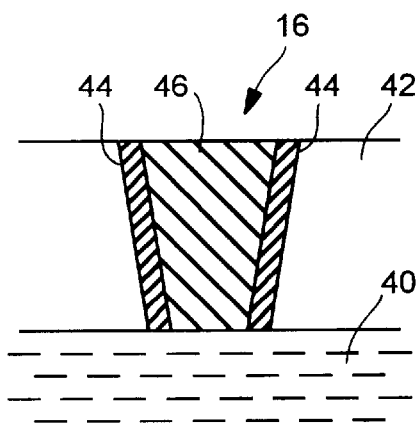
FIG. 2 is a schematic cross-section through a thermally insulating structure forming part of the circuit.

FIG. 2 is a cross-sectional view of one of the trenches 16, formed within an active layer 42 of silicon, above a horizontal layer 40 of silicon dioxide.

As an example, the active layer 42 of silicon may have a depth of 5.5 $\mu$m, and the trench 16 may have a width of approximately 1.8 $\mu$m at the upper surface of the silicon, and a width of approximately 1 $\mu$m at the bottom, where it is in contact with the horizontal layer 40, which in this case has a thickness of approximately 3 $\mu$m. The bottom of the trench 16 may, however, be separated from the horizontal layer 40 if desired. The walls 44 of the trench are formed of silicon dioxide, while the rest of the trench 46 is filled with undoped polysilicon. The walls 44 may have a thickness in the region of 350 nm, for example.

The structure illustrated here includes a pair of trenches in each trench structure, completely surrounding the relevant components. However, it should be noted that the structure may include any number of trenches, and may surround the component to any desired degree, in order to provide the required degree of thermal insulation. Thus, it is not essential to achieve complete electrical isolation, and a satisfactory degree of thermal insulation may be achieved by a trench structure which has gaps in it.

The purpose of the trench structures is to insulate the heated diode 2 and the reference diode 4 from external temperature sources, and to contain heat supplied from the heating element 14 to the diode 2.

At the start of a cycle of operation, the diodes 2, 4 are at the same temperature within the body of the integrated circuit. As a result, their forward voltage drops are equal, and the comparator 12 detects that there is no difference between these two voltages V2 and V4. When a current is supplied to the heating element 14, it begins to heat up, and the temperature of the diode 2 increases. As a result, the forward voltage drop V2 of the diode 2 falls, at a rate of approximately −2 mV/K. When the temperature reaches a particular point, the voltage V2 differs from the voltage drop V4 across the unheated diode by a predetermined amount, as detected by the comparator 12, and the comparator output, as detected in the control circuit 10, indicates that the timed period has ended.

The current to the heating element 14 is then stopped, and, over time, the temperature of the diode 2 falls to be approximately the same as that of the reference diode 4, and the cycle can restart.

The current supplied to the heating element 14 may be continuous during those periods when heating is required, or may be switched on in short pulses.

The rate at which the diode is heated may be altered by changing the current supplied to the heating element 14. Moreover, the voltage difference (and hence temperature difference) required to trigger the end of the timed period can be controlled by controlling the comparator 12. Variations in both of these parameters can be used to change the duration of the timed period.

As an alternative to heating a component, the voltage difference may be achieved by cooling a component with a temperature-dependent parameter.

There is thus described a circuit which can be used to provide a timed period within an integrated circuit.

Circuits in accordance with the invention may be of particular use in relatively high voltage applications, for which the use of a high density digital process (which is how one might otherwise build the timing circuit) is not possible.

Purely as examples, the circuit of the present invention may be used as a lamp cadence controller for a telephone terminal display circuit, as a timing circuit for controlling one of several possible functions (for example flashing indicator lights) in automobile applications, or as a replacement for a charge pump type low pass filter circuit.

In these examples, and in many others, the circuit in accordance with the invention can be implemented at low cost and without requiring large areas of space in the integrated circuit.

What is claimed is:

1. A timing circuit, comprising:
   first and second matched temperature dependent integrated circuit components;
   the first and second components being located within respective first and second thermally insulating structures within an integrated circuit;
   the first thermally insulating structure further containing a device for varying the temperature of the first component; and
   a device for comparing the values of temperature dependent parameters of the first and second components; wherein
   the temperature of the first and second components are approximately equal at the beginning of a timing cycle and the temperature of the first component is varied until the device for comparing detects a threshold temperature dependent parameter difference between the first and second components, the timing cycle ends upon detection of the threshold temperature dependent parameter difference.

2. A timing circuit as claimed in claim 1, wherein the device for comparing detects a threshold voltage difference between the first and second components.

3. A timing circuit as claimed in claim 2, wherein the first and second components are resistors.

4. A timing circuit as claimed in claim 2, wherein the first and second components are diodes.

5. A timing circuit as claimed in claim 2, wherein the first and second components are transistors.

6. A timing circuit as claimed in claim 1, wherein the device for varying the temperature comprises a heating device for supplying heat to the first component.

7. A timing circuit as claimed in claim 6, wherein the heating device is a resistor or a diode or a transistor.

8. A timing circuit as claimed in claim 1, wherein the first and second thermally insulating structures are in the form of trench structures, surrounding the respective components, the trench structures containing a thermally insulating material.

9. A timing circuit as claimed in claim 8, wherein the thermally insulating structures contain silicon dioxide.

10. A timing circuit as claimed in claim 1, wherein the timing circuit is contained in a single integrated circuit.

11. A timing circuit, comprising:
    first and second matched temperature dependent integrated circuit components;
    first and second thermally insulating structures within the integrated circuit, surrounding the first and second components respectively;
    means for varying heat to one of the first and second components;
    means for obtaining first and second electrical signals representative of values of temperature dependent parameters of the first and second components; and
    means for comparing the values of the first and second signals, the temperature of the first and second components are approximately equal at the beginning of a timing cycle and the timing cycle ends when the means for comparing detects a threshold difference between the electrical signals representative of at least one temperature dependent parameter of the first and second components.

12. A timing circuit as claimed in claim 11, wherein the at least one temperature dependent parameter comprises a voltage across the first and second components respectively.

13. A timing circuit as claimed in claim 11, wherein the means for varying heat comprises a heating device, the heating device is located within one of the first and second thermally insulating structures and supplies heat to one of the first and second components.

* * * * *